(12) United States Patent
Imai et al.

(10) Patent No.: US 10,651,363 B2
(45) Date of Patent: *May 12, 2020

(54) POWER GENERATING DEVICE

(71) Applicant: Ricoh Company, Ltd., Tokyo (JP)

(72) Inventors: Takahiro Imai, Tokyo (JP); Tsuneaki Kondoh, Kanagawa (JP); Tomoaki Sugawara, Kanagawa (JP); Yuko Arizumi, Kanagawa (JP); Junichiro Natori, Kanagawa (JP); Mayuka Araumi, Tokyo (JP); Mizuki Otagiri, Kanagawa (JP); Megumi Kitamura, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 651 days.

This patent is subject to a terminal disclaimer.

(21) Appl. No.: 15/337,679

(22) Filed: Oct. 28, 2016

(65) Prior Publication Data

US 2017/0148973 A1 May 25, 2017

(30) Foreign Application Priority Data

Nov. 20, 2015 (JP) .................................. 2015-228081

(51) Int. Cl.
*H01L 41/053* (2006.01)
*H02N 2/08* (2006.01)
(Continued)

(52) U.S. Cl.
CPC ........ *H01L 41/053* (2013.01); *H01L 41/1134* (2013.01); *H02N 1/08* (2013.01)

(58) Field of Classification Search
CPC ...... H01L 41/053; H01L 41/1134; H02N 1/08
(Continued)

(56) References Cited

U.S. PATENT DOCUMENTS

RE32,180 E * 6/1986 Lewiner ............... A61B 5/1036
307/400
2010/0164231 A1 * 7/2010 Tsou ......................... F03D 5/00
290/55
(Continued)

FOREIGN PATENT DOCUMENTS

JP H06-336716 A 12/1994
JP 2014207391 A * 10/2014 ............ H01L 41/113
(Continued)

OTHER PUBLICATIONS

Kozue Kobayashi, "Vibration of Large Truck Deck", *Motor Ring*, No. 35, pp. 1-3, 2012, Society of Automotive Engineers of Japan, 4 pages.
(Continued)

*Primary Examiner* — Thomas M Dougherty
(74) *Attorney, Agent, or Firm* — Oblon, McClelland, Maier & Neustadt, L.L.P

(57) ABSTRACT

A power generating device is provided. The power generating device includes an element having flexibility and a support to support at least one portion of the element. The element is capable of undergoing a deformation when receiving a vibration and capable of generating power when undergoing the deformation. The deformation includes at least one of a bending deformation, a torsional deformation, and a bending-torsional complex deformation.

9 Claims, 9 Drawing Sheets

(51) Int. Cl.
  *H01L 41/113* (2006.01)
  *H02N 1/08* (2006.01)
(58) Field of Classification Search
  USPC .................. 310/339, 307, 308; 322/2 R
  See application file for complete search history.

(56) References Cited

U.S. PATENT DOCUMENTS

| | | | |
|---|---|---|---|
| 2011/0227545 A1* | 9/2011 | Nakatsuka | H02N 1/08 322/2 R |
| 2011/0260699 A1* | 10/2011 | Nakatsuka | H01G 7/02 322/2 R |
| 2012/0283807 A1* | 11/2012 | Deterre | A61N 1/3785 607/116 |
| 2014/0015378 A1* | 1/2014 | Filardo | H02N 2/18 310/339 |
| 2014/0099528 A1* | 4/2014 | Lockett | H01M 4/06 429/124 |
| 2014/0265733 A1* | 9/2014 | Balasingam | H02N 2/185 310/339 |
| 2016/0164390 A1* | 6/2016 | Furukawa | H02K 35/02 310/339 |
| 2016/0197261 A1* | 7/2016 | Abdelkefi | H01L 41/1136 310/312 |
| 2016/0276957 A1* | 9/2016 | Sugawara | H02N 2/186 |
| 2016/0344309 A1* | 11/2016 | Otagiri | H02N 2/18 |
| 2017/0093305 A1* | 3/2017 | Sugawara | B63C 9/0005 |
| 2017/0170749 A1* | 6/2017 | Arizumi | H02N 1/04 |
| 2017/0207729 A1* | 7/2017 | Kondoh | F03G 5/00 |
| 2017/0214338 A1* | 7/2017 | Otagiri | H02N 1/04 |
| 2018/0145244 A1* | 5/2018 | Otagiri | G01L 5/226 |

FOREIGN PATENT DOCUMENTS

| | | |
|---|---|---|
| JP | 2014-239647 A | 12/2014 |
| WO | WO2009/127823 A2 | 10/2009 |

OTHER PUBLICATIONS

Japanese Office Action, Dispatch No. 321823, dated Aug. 6, 2018 in Japanese Patent Application No. 2015-228061 (3 pages).

* cited by examiner

POWER SPECTRUM DENSITY OF
VIBRATION OF LARGE TRUCK DECK

POWER GENERATING DEVICE

CROSS-REFERENCE TO RELATED APPLICATIONS

This patent application is based on and claims priority pursuant to 35 U.S.C. § 119(a) to Japanese Patent Application No. 2015-228081, filed on Nov. 20, 2015, in the Japan Patent Office, the entire disclosure of which is hereby incorporated by reference herein.

BACKGROUND

Technical Field

The present disclosure relates to a power generating device.

Description of the Related Art

There have been attempts to effectively utilize vibration energy. Vibration energy is generally generated from vibrations caused by structural bodies (e.g., roads, bridges, and buildings) and traveling bodies (e.g., automobiles such as trucks, and railroad vehicles).

As one method of effectively utilizing such environmental vibration energy, a method of converting vibration energy into electric energy is known.

Specifically, a method using a piezoelectric element, a method using electrostatic induction, and a method using electromagnetic induction are known.

SUMMARY

In accordance with some embodiments of the present invention, a power generating device is provided. The power generating device includes an element having flexibility and a support to support at least one portion of the element. The element is capable of undergoing a deformation when receiving a vibration and capable of generating power when undergoing the deformation. The deformation includes at least one of a bending deformation, a torsional deformation, and a bending-torsional complex deformation.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

Figure 1A:
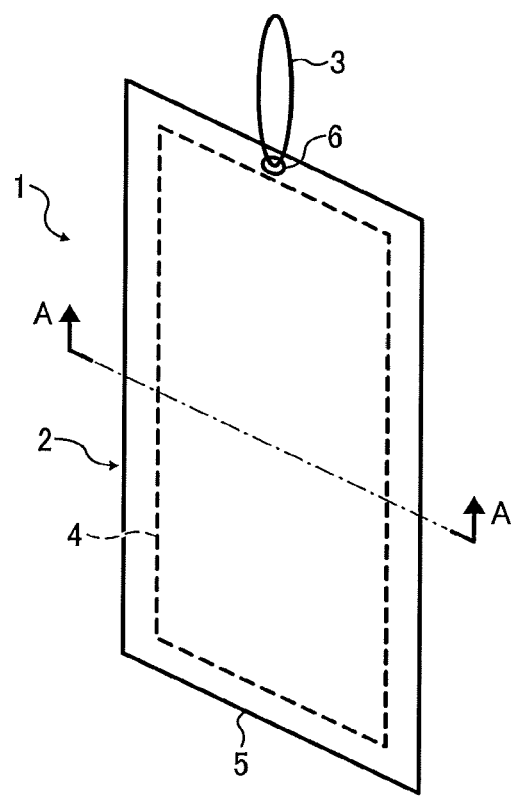
FIG. 1A is a perspective view of a power generating device according to a first embodiment of the present invention, in a state of receiving no vibration.

The accompanying drawings are intended to depict example embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Within the context of the present disclosure, if a first layer is stated to be "overlaid" on, or "overlying" a second layer, the first layer may be in direct contact with a portion or all of the second layer, or there may be one or more intervening layers between the first and second layer, with the second layer being closer to the substrate than the first layer.

Embodiments of the present invention are described in detail below with reference to accompanying drawings. In describing embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

For the sake of simplicity, the same reference number will be given to identical constituent elements such as parts and materials having the same functions and redundant descriptions thereof omitted unless otherwise stated.

In accordance with some embodiments of the present invention, a power generating device is provided which effectively generates power using environmental vibration energy within all the frequency range without adjusting the resonance frequency. The power generating device is capable of reducing cost, since a resonance frequency adjuster is needless.

As an example, environmental vibration energy generated from vibration of truck decks can be used for generating power. In this case, the source of vibration could be the engine of a truck, irregularities on roadway surface, or an acceleration load caused by drive operations (e.g., acceleration, brake, or steering wheel operation).

Figure 5:
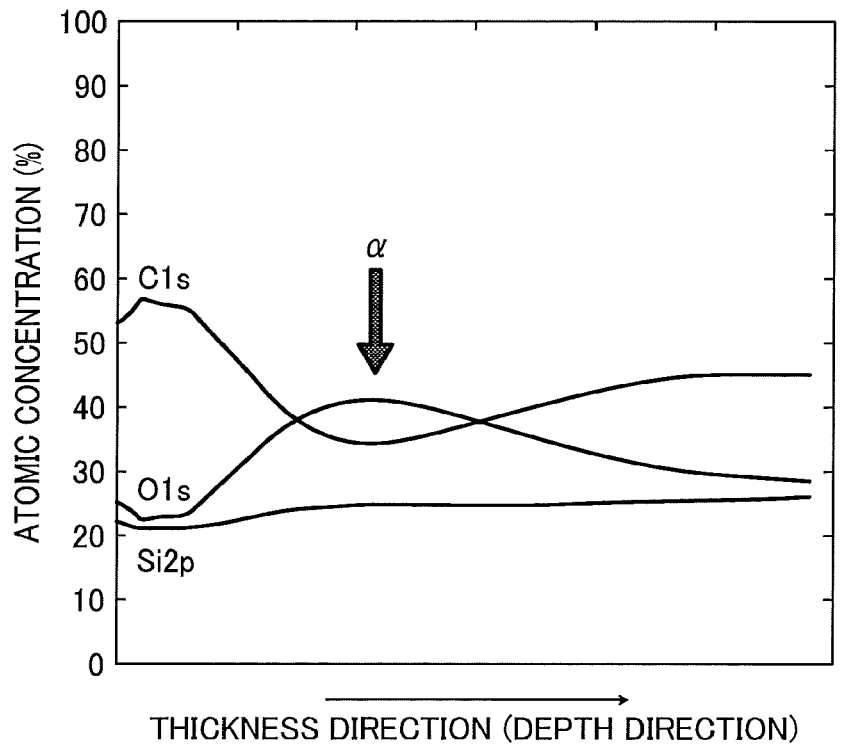
FIG. 5 is an XPS (X-ray photoelectron spectroscopy) chart of a surface-modified inactivated intermediate layer, formed of a silicone rubber, of the power generating device according to an embodiment of the present invention.
Figure 18:
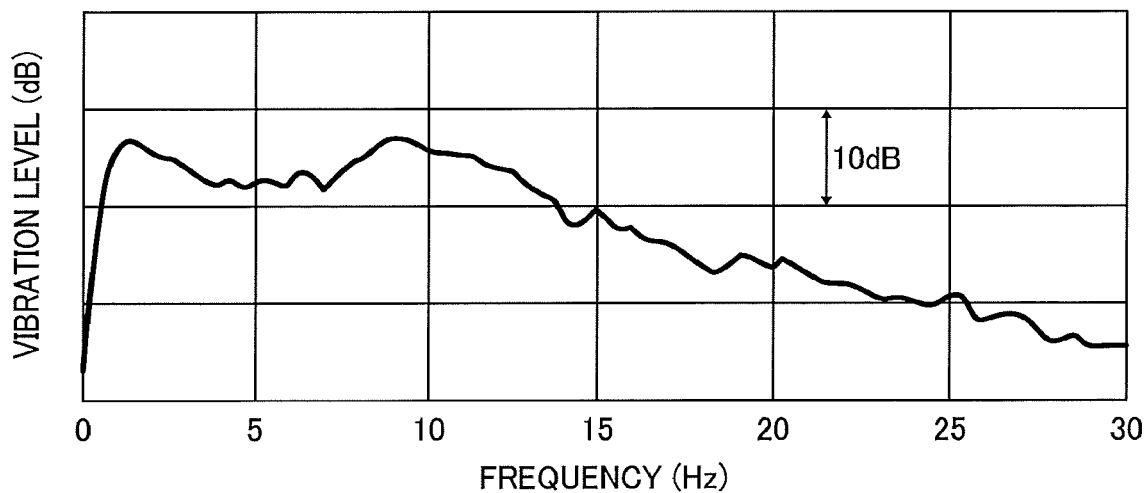
FIG. 18 is a graph showing a frequency characteristic of a vibration caused by a large truck deck.

FIG. 18 is a graph showing a power spectrum density (vibration frequency distribution) of a large truck deck, disclosed as FIG. 5 in, Kozue Kobayashi, "Vibration of Large Truck Deck", *Motor Ring*, No. 35, 2012, Society of Automotive Engineers of Japan. As illustrated in FIG. 18, the vibration frequency distribution of the large truck is a wideband spectrum distributed over the low-frequency range, not a single frequency spectrum.

It has been difficult for conventional power generating devices to use environmental vibration energy within all the frequency range. When the usable frequency range is largely deviated from the vibration frequency, only a part of the vibration energy can be used, resulting in poor power generation efficiency. In particular, conventional electromagnetic power generative devices are less expected to effectively generate power using a vibration within a low-frequency range, such as a vibration of a truck deck, since the power generation output is proportional to the square of the traveling speed.

A first embodiment of the present invention is described below with reference to FIGS. 1A and 1B and FIGS. 2A and 2B. Referring to FIG. 1A, a power generating device 1 includes an element 2 and a variable support 3. The element 2 is a thin-flat-plate-like member having flexibility. The variable support 3 is a deformable member that supports one portion of the element 2 on an upper part thereof such that the element 2 is suspended in the air. The variable support 3 is a string member having flexibility, formed into a loop. The variable support 3 is deformable along with a deformation of the element 2.

The element 2 includes an element body 4 and a cover 5. The element body 4 has flexibility and is capable of generating power when deforming. The cover 5 has flexibility and covers the whole outer surface of the element body 4.

The cover 5 includes a two-layer PET (polyethylene terephthalate) film, each layer having a thickness of 75 μm. The cover 5 is laminated over the element body 4. A small hole 6 is formed on an upper adhesive part of the cover 5. The variable support 3 is passed through the hole 6.

Alternatively, the element 2 may be supported with a string-like variable support having flexibility or elasticity, by joining one end of the string-like variable support directly to the element body 4, without forming the hole 6. Even in this case, the element 2 is easily deformable, and the variable support is easily deformable along with a deformation of the element 2. The cover 5 is not limited in material and thickness.

In the power generating device 1 according to the first embodiment, the element 2 is supported at one portion on an upper part thereof to be suspended in the air. When a vibration is generated with an upper end portion of the variable support 3 being fixed to a fixation member, the vibration will be transmitted to the element 2 through the variable support 3, and the element 2 will be caused to swing and/or undulate by the vibration.

Figure 1B:
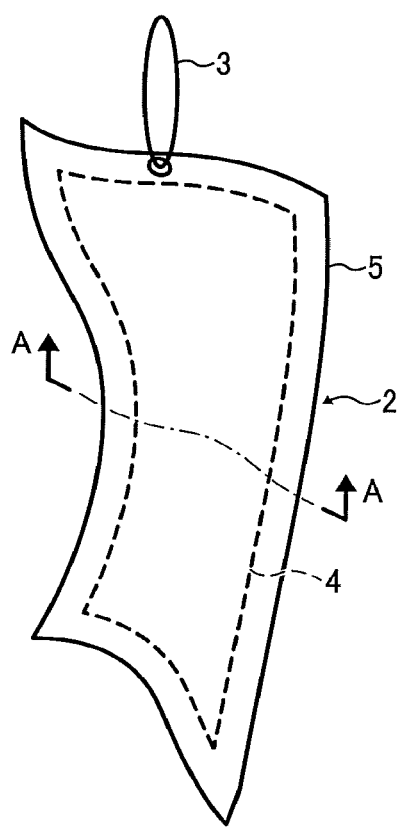
FIG. 1B is a perspective view of the power generating device according to the first embodiment of the present invention, in a state of being deformed by a vibration.
Figure 1B:
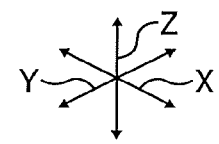

The direction of swing and/or undulation may be either the vertical direction (direction of gravity) indicated by Z axis, the lateral direction indicated by X axis, or the longitudinal direction indicated by Y axis, in FIG. 1B.

The element 2 and the variable support 3 are in point contact with each other. Having flexibility, the variable support 3 does not restrict the movement of the element 2 in all directions other than the vertical direction.

When receiving a vibration, the element 2 is caused to swing and/or undulate and undergo a deformation, such as bending deformation, torsional deformation, and a bending-torsional complex deformation, as illustrated in FIG. 1B, owing to the flexibility of the element 2. Since the variable support 3 also deforms along the deformation of the element 2, the degree of deformation of the element 2 is greater than the case in which the element 2 is supported with a fixed support.

In the present disclosure, "flexibility" includes the concept of restorability. Restorability refers to an ability to be restored to a previous condition. A vibration causes a deformation of the element 2, and the deformation of the element 2 causes power generation. In addition, a restoration of the deformed element 2 also causes power generation.

The element 2 repeats deformation and restoration while receiving a vibration, thus continuously generating power.

The mechanism of power generation is described in detail below with reference to FIGS. 2A and 2B.

Figure 2A:
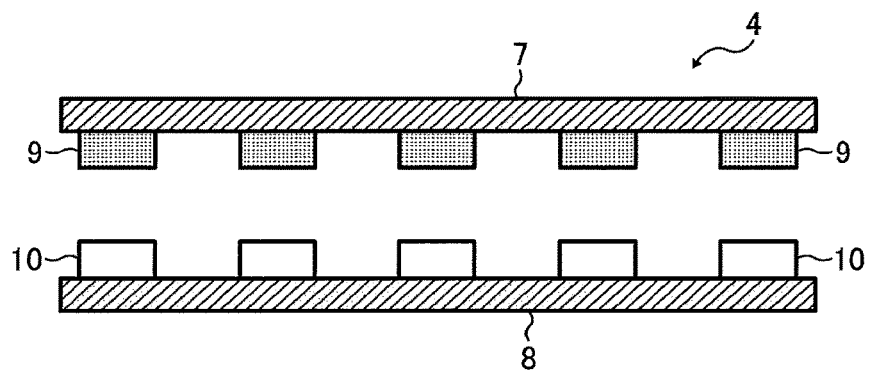
FIGS. 2A and 2B are cross-sectional views taken from line A-A of FIGS. 1A and 1B, respectively.

FIG. 2A is a part of a cross-sectional view taken from a line A-A of FIG. 1A. As illustrated in FIG. 2A, the element body 4 includes bases 7 and 8 each having non-conductivity and flexibility, an electret electrode 9 facing the base 7, and a metal electrode 10 facing the base 8.

The electret electrode 9 includes an electret dielectric body into which charge has been injected so as to semipermanently hold the charge.

In between the bases 7 and 8, a spacer is disposed, for forming a gap between the electret electrode 9 and the metal electrode 10.

Figure 2B:
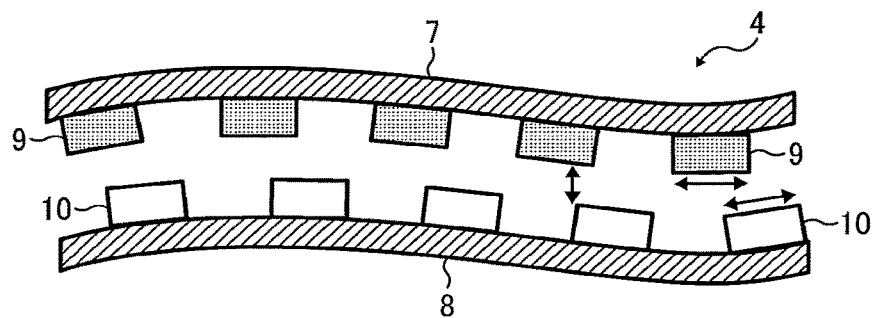

As the element 2 is deformed, as illustrated in FIG. 2B, the distance between the electrodes is reduced and/or the overlapping area of the facing electrodes is varied, thus generating power based on the electrostatic induction principle. The generated power may be taken out by connecting the metal electrodes 10.

In place of providing the bases 7 and 8 for supporting the electrodes, the cover 5 itself may be served as a support for supporting the electrodes.

A second embodiment of the present invention is described below with reference to FIGS. 3 to 10. For the sake of simplicity, the same reference number will be given to identical constituent elements such as parts and materials having the same functions and redundant descriptions thereof omitted unless otherwise stated.

Figure 3:
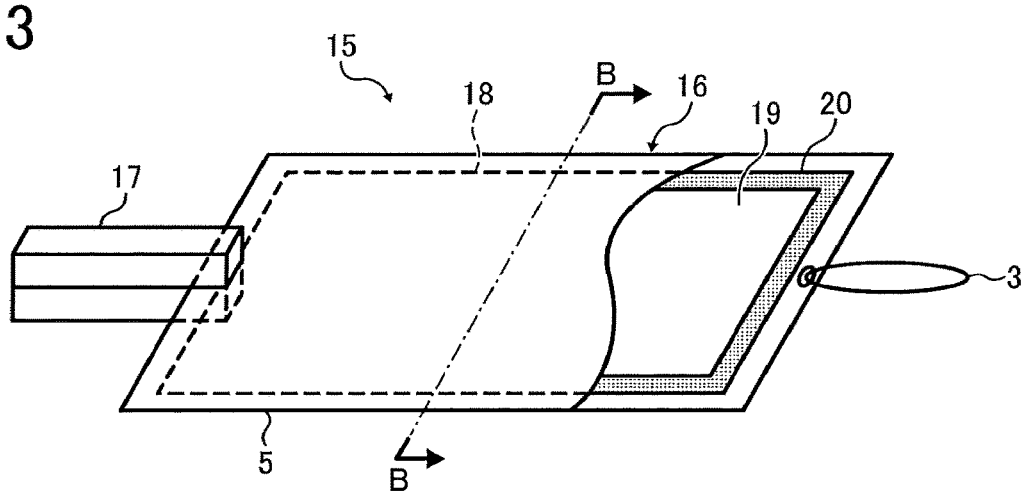
FIG. 3 is a perspective view of a power generating device according to a second embodiment of the present invention, in a state of receiving no vibration.

Referring to FIG. 3, a horizontally-arranged power generating device 15 includes an element 16, a variable support 3, and a fixed support 17. The element 16 is a thin-flatplate-like member having flexibility. The variable support 3 supports one end portion (a right end portion) of the element 16 such that the element 16 is suspended. The fixed support 17 supports the other end portion (a left end portion) of the element 16 such that a certain area of the element 16 is sandwiched therewith. This configuration makes the element 16 suspended in the air.

The element 16 includes an element body 18 and a cover 5. The element body 18 is a piezoelectric element having flexibility and capable of generating power when deforming.

Figure 4:
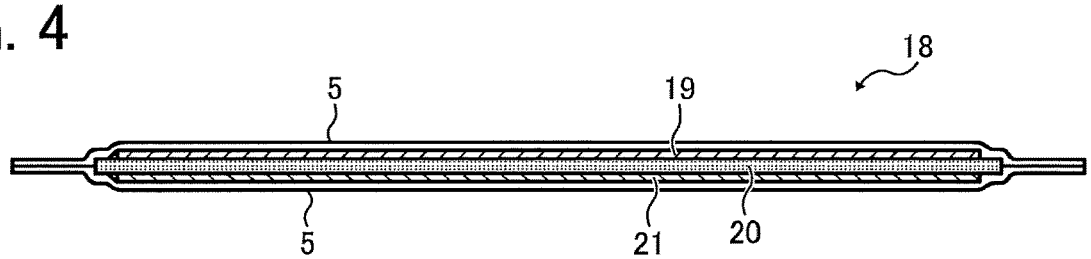
FIG. 4 is a cross-sectional view taken from line B-B of FIG. 3.

FIG. 4 is a cross-sectional view taken from line B-B of FIG. 3. As illustrated in FIG. 4, the element body 18 includes a first electrode 19, an intermediate layer 20 overlying the first electrode 19, and a second electrode 21 overlying the intermediate layer 20.

In the present embodiment, the first electrode 19 and the second electrode 21, serving as metal electrodes, are formed of a conductive cloth Sui-10-70 (product of Seiren Co., Ltd.), but the material of the electrodes are not limited thereto.

The element body 18 exhibits a property similar to piezoelectric property. When a deformation imparting force is applied to the element body 18, the first and second surfaces of the intermediate layer 20, respectively facing the first electrode 19 and the second electrode 21, deform at different degrees of deformation, thereby causing power generation.

First Electrode and Second Electrode

The first electrode 19 and the second electrode 21 are not limited in material, shape, size, and structure.

The first electrode 19 and the second electrode 21 are either common or different in material, shape, size, and/or structure. Preferably, the first electrode 19 and the second electrode 21 are common in these properties.

Specific examples of materials used for the first electrode 19 and the second electrode 21 include, but are not limited to, metals, carbon-based conductive materials, conductive rubber compositions.

Specific examples of the metals include, but are not limited to, gold, silver, copper, aluminum, stainless steel, tantalum, nickel, and phosphor bronze. Specific examples of the carbon-based conductive materials include, carbon nanotube, carbon fibers, and graphite. Specific examples of the conductive rubber compositions include, but are not limited to, a composition including a conductive filler and a rubber.

Specific examples of the conductive filler include, but are not limited to, carbon materials (e.g., Ketjen black, acetylene black, graphite, carbon fiber (CF), carbon nanofiber (CNF), carbon nanotube (CNT), graphene), metal fillers (e.g., gold, silver, platinum, copper, aluminum, nickel), conductive polymeric materials (e.g., derivatives of polythiophene, polyacetylene, polyaniline, polypyrrole, polyparaphenylene, or polyparaphenylene vinylene, to which a dopant, such as anion and cation, may be added), and ionic liquids. Each of these materials can be used alone or in combination with others.

Specific examples of the rubber include, but are not limited to, silicone rubber, modified silicone rubber, acrylic rubber, chloroprene rubber, polysulfide rubber, urethane rubber, isobutyl rubber, fluorosilicone rubber, ethylene rubber, natural rubber (latex), ethylene propylene rubber, nitrile rubber, and fluorine rubber. Each of these materials can be used alone or in combination with others.

The first electrode 19 and the second electrode 21 may be in the form of a thin film. The first electrode 19 and the second electrode 21 may be made of woven fabric, non-woven fabric, knit fabric, mesh, sponge, or non-woven fabric formed by layering fibrous carbon materials.

The first electrode 19 and the second electrode 21 preferably have an average thickness in the range of from 0.01 μm to 1 mm, more preferably from 0.1 to 500 μm, from the aspect of conductivity and flexibility. When the average thickness is 0.01 μm or more, the mechanical strength becomes appropriate and the conductivity improves. When the average thickness is 1 mm or less, the element becomes deformable, thus providing good power generation performance.

Intermediate Layer

The intermediate layer 20 has flexibility.

The intermediate layer 20 satisfies at least one of the following conditions (1) and (2).

Condition (1): When a pressure is applied to the intermediate layer 20 from a direction perpendicular to the plane of the intermediate layer 20, the amount of deformation of a first side of the intermediate layer 20 facing the first electrode 19 and that of a second side of the intermediate layer 20 facing the second electrode 21 are different.

Condition (2): The universal hardness (H1) of the first side of the intermediate layer 20 facing the first electrode 19 and the universal hardness (H2) of the second side of the intermediate layer 20 facing the second electrode 21 are different, when the indentation depth is 10 μm.

As the amount of deformation or the hardness is different between both sides of the intermediate layer 20, a large amount of power can be generated.

Here, the amount of deformation is defined as the maximum indentation depth of an indenter, when the indenter is pressed against the intermediate layer 20 under the following conditions.

Measurement Conditions

Measuring instrument: Microhardness tester WIN-HUD available from Fischer

Indenter: Quadrangular diamond indenter having a facing angle of 136°

Initial load: 0.02 mN

Maximum load: 1 mN

Load increasing time from initial load to maximum load: 10 seconds

The universal hardness is measured under the following conditions.

Measurement Conditions

Measuring instrument: Microhardness tester WIN-HUD available from Fischer

Indenter: Quadrangular diamond indenter having a facing angle of 136°

Indentation depth: 10 μm

Initial load: 0.02 mN

Maximum load: 100 mN

Load increasing time from initial load to maximum load: 50 seconds

The ratio (H1/H2) of the universal hardness (H1) to the universal hardness (H2) is preferably 1.01 or more, more preferably 1.07 or more, and most preferably 1.13 or more. The upper limit of the ratio (H1/H2) is variable according to the degree of flexibility required by the use condition and/or the load applied in the use condition. However, the ratio (H1/H2) is preferably 1.70 or less. The universal hardness (H1) is a hardness of a relatively hard surface. The universal hardness (H2) is a hardness of a relatively soft surface.

Specific examples of materials used for the intermediate layer 20 include, but are not limited to, rubbers and rubber compositions. Specific examples of the rubbers include, but are not limited to, silicone rubber, fluorosilicone rubber, acrylic rubber, chloroprene rubber, natural rubber (latex), urethane rubber, fluorine rubber, and ethylene propylene rubber. Each of these materials can be used alone or in combination with others. Among these rubbers, silicone rubber is preferable.

The silicone rubber is not limited in structure so long as organosiloxane bonds are included.

Specific examples of the silicone rubber include, but are not limited to, dimethyl silicone rubber, methyl phenyl silicone rubber, modified (e.g., acrylic-modified, alkyd-modified, ester-modified, epoxy-modified) silicone rubber. Each of these materials can be used alone or in combination with others.

Specific examples of the rubber compositions include, but are not limited to, a composition including a filler and at least one of the above-described rubbers. Among these rubber compositions, a silicone rubber composition including the above-described silicone rubbers is preferable.

The filler may be either an organic filler, an inorganic filler, or an organic-inorganic composite filler. Any organic compounds can be used as the organic filler.

Specific examples of the organic filler include, but are not limited to, fine particles of acrylic resin, melamine resin, or fluororesin (e.g., polytetrafluoroethylene), silicone powder (e.g., silicone resin powder, silicone rubber powder, silicone composite powder), rubber powder, wood powder, pulp, and starch.

Any inorganic compounds can be used as the inorganic filler. Specific examples of the inorganic filler include, but are not limited to, oxides, hydroxides, carbonates, sulfates, silicates, nitrides, carbons, metals, and other compounds.

Specific examples of the oxides include, but are not limited to, silica, diatom earth, alumina, zinc oxide, titanium oxide, iron oxide, and magnesium oxide. Specific examples of the hydroxides include, but are not limited to, aluminum hydroxide, calcium hydroxide, and magnesium hydroxide.

Specific examples of the carbonates include, but are not limited to, calcium carbonate, magnesium carbonate, barium carbonate, and hydrotalcite. Specific examples of the sulfates include, but are not limited to, aluminum sulfate, calcium sulfate, and barium sulfate.

Specific examples of the silicates include, but are not limited to, calcium silicate (e.g., wollastonite, xonotlite), zirconia silicate, kaolin, talc, mica, zeolite, pearlite, bentonite, montmorillonite, sericite, activated clay, glass, and hollow glass beads. Specific examples of the nitrides include, but are not limited to, aluminum nitride, silicon nitride, and boron nitride.

Specific examples of the carbons include, but are not limited to, Ketjen black, acetylene black, graphite, carbon fiber, carbon nanofiber, carbon nanotube, fullerene (and derivatives thereof), and graphene.

Specific examples of the metals include, but are not limited to, gold, silver, platinum, copper, iron, aluminum, and nickel. Specific examples of the other compounds include, but are not limited to, potassium titanate, barium titanate, strontium titanate, lead zirconate titanate, silicon carbide, and molybdenum sulfide. The inorganic filler may be surface-treated.

As the organic-inorganic composite filler, a compound in which an organic compound and an inorganic compound are combined on the molecular level may be used.

Specific examples of the organic-inorganic composite filler include, but are not limited to, silica-acrylic composite particles and silsesquioxane.

The filler preferably has an average particle diameter in the range of from 0.01 to 30 µm, more preferably from 0.1 to 10 µm. When the average particle diameter is 0.01 µm or more, power generation performance may be improved. When the average particle diameter is 30 µm or less, the intermediate layer 20 becomes deformable, thus improving power generation performance.

The average particle diameter can be measured by a known particle size distribution analyzer, such as MICROTRACK HRA (available from Nikkiso Co., Ltd.), by a known method.

The content of the filler in the rubber composition is preferably in the range of from 0.1 to 100 parts by mass, more preferably from 1 to 50 parts by mass, based on 100 parts by mass of the rubber. When the content is 0.1 parts by mass or more, power generation performance may be improved. When the content is 100 parts by mass or less, the intermediate layer 20 becomes deformable, thus improving power generation performance.

The rubber composition may further include other components, such as an additive. The contents of the other components may be appropriately determined so long as the effect of the present invention is not damaged.

Specific examples of the additive include, but are not limited to, a cross-linker, a deterioration preventer, a heat resistant agent, and a colorant.

Materials used for the intermediate layer 20 may be prepared by any known method. For example, the rubber composition may be prepared by mixing the rubber, the filler, and other optional components, and kneading the mixture.

The intermediate layer 20 may be formed by any known method. For example, a thin layer of the rubber composition may be formed by hardening the rubber composition, coated on a substrate by means of blade coating, die coating, or dip coating, with heat or electron beam.

The intermediate layer 20 preferably has an average thickness in the range of from 1 µm to 10 mm, more preferably from 20 µm to 1 mm, from the aspect of deformation following property. When the average thickness is within the above preferable range, the intermediate layer 20 can exhibit sufficient film formation property without inhibiting deformation property, thus providing good power generation performance.

Preferably, the intermediate layer 20 has insulation property. More specifically, the intermediate layer 20 preferably has a volume resistivity of $10^8$ Ωcm or more, more preferably $10^{10}$ Ωcm or more. The intermediate layer 20 may have a multi-layered structure.

Surface Modification Treatment and Inactivation Treatment

As methods for making both sides of the intermediate layer 20 different in the amount of deformation or hardness, a surface modification treatment or an inactivation treatment may be employed. Such a treatment may be performed for either both sides or one side of the intermediate layer 20.

Surface Modification Treatment

Specific examples of the surface modification treatment include, but are not limited to, plasma treatment, corona discharge treatment, electron irradiation treatment, ultraviolet irradiation treatment, ozone treatment, and radiation (e.g., X-ray, α-ray, β-ray, γ-ray, neutron ray) irradiation treatment. From the aspect of processing speed, plasma treatment, corona discharge treatment, and electron irradiation treatment are preferable. The surface modification treatment is not limited to any particular treatment so long as a certain degree of irradiation energy is sufficiently provided to modify a material.

Plasma Treatment

Plasma generators for use in the plasma treatment may be of parallel plate type, capacitive coupling type, or inductive coupling type. In addition, atmospheric pressure plasma generators may also be used for the plasma treatment. In particular, a reduced-pressure plasma treatment is preferable from the aspect of durability.

The reaction pressure in the plasma treatment is preferably in the range of from 0.05 to 100 Pa, and more preferably from 1 to 20 Pa.

As the reaction atmosphere in the plasma treatment, inert gas, rare gas, and oxygen gas are suitable. In particular, argon is preferable from the aspect of persistence of the effect.

The reaction atmosphere preferably has an oxygen partial pressure of 5,000 ppm or less. When the reaction atmosphere has an oxygen partial pressure of 5,000 ppm or less, generation of ozone is suppressed and the use of an ozone treatment equipment is reduced.

In the plasma treatment, the amount of irradiation electric energy, defined by the product of output and irradiation time, is preferably in the range of from 5 to 200 Wh, more preferably from 10 to 50 Wh. When the amount of irradiation electric energy is within the above preferable range, the intermediate layer 20 is given a power generation function without degrading durability by excessive irradiation.

Corona Discharge Treatment

In the corona discharge treatment, the amount of applied (accumulated) energy is preferably in the range of from 6 to 300 J/cm$^2$, more preferably from 12 to 60 J/cm$^2$. When the amount of applied energy is within the above preferable range, the intermediate layer 20 is given a power generation function without degrading durability by excessive irradiation.

Electron Irradiation Treatment

In the electron irradiation treatment, the irradiation amount is preferably 1 kGy or more, and more preferably in the range of from 300 kGy to 10 MGy. When the irradiation amount is within the above preferable range, the intermediate layer 20 is given a power generation function without degrading durability by excessive irradiation.

As the reaction atmosphere in the electron irradiation treatment, an inert gas (e.g., argon gas, neon gas, helium gas, nitrogen gas) having an oxygen partial pressure of 5,000 ppm or less is preferable. When the reaction atmosphere has an oxygen partial pressure of 5,000 ppm or less, generation of ozone is suppressed and the use of an ozone treatment equipment is reduced.

Ultraviolet Irradiation Treatment

In the ultraviolet irradiation treatment, the ultraviolet ray preferably has a wavelength of from 200 to 365 nm, more preferably from 240 to 320 nm.

In the ultraviolet irradiation treatment, the accumulated amount of light is preferably in the range of from 5 to 500 J/cm$^2$, more preferably from 50 to 400 J/cm$^2$. When the accumulated amount of light is within the above preferable range, the intermediate layer 20 is given a power generation function without degrading durability by excessive irradiation.

As the reaction atmosphere in the ultraviolet irradiation treatment, an inert gas (e.g., argon gas, neon gas, helium gas, nitrogen gas) having an oxygen partial pressure of 5,000 ppm or less is preferable. When the reaction atmosphere has an oxygen partial pressure of 5,000 ppm or less, generation of ozone is suppressed and the use of an ozone treatment equipment is reduced.

There is a conventional technology for improving an interlayer adhesion force by forming active groups by means of excitation or oxidization caused by a plasma treatment, corona discharge treatment, ultraviolet irradiation treatment, or electron irradiation treatment. However, such a technology has a limited application to improvement of interlayer adhesion force. It is known that application of that technology to outermost surface modification treatments causes a significant deterioration in releasability of the outermost surface, which is not preferable. Moreover, in that technology, a reactive active group (e.g., hydroxyl group) is efficiently introduced under an oxygen-rich reaction condition. That conventional technology is essentially different from the surface modification treatments in accordance with some embodiments of the present invention.

The plasma treatment, as an example of the surface modification treatment in accordance with some embodiments of the present invention, is performed under a reduced-pressure environment with a small amount of oxygen. Such a plasma treatment accelerates re-cross-linkage or recombination of the surface and increases the number of Si—O bonds having a high bond energy, improving the durability of the surface.

In addition, since the surface is densified owing to the increased cross linkage density, the releasability of the surface is also improved. Although active groups are formed in part, such active groups are inactivated by a coupling agent or an air drying treatment.

Inactivation Treatment

The surface of the intermediate layer 20 may be subjected to an inactivation treatment using any material.

The inactivation treatment is not limited to any particular process so long as the surface of the intermediate layer 20 is inactivated. For example, the inactivation treatment may include imparting an inactivator to the surface of the intermediate layer 20. Here, inactivation of the intermediate layer 20 refers to a phenomenon in which the nature of the surface of the intermediate layer 20 is changed to have less chemical reactivity. Specifically, the degree of activity of the surface of the intermediate layer 20 is reduced by reacting the surface with an inactivator with active groups (e.g., —OH groups) generated by excitation or oxidization caused by a plasma treatment, corona discharge treatment, ultraviolet irradiation treatment, or electron irradiation treatment.

Specific examples of the inactivator include, but are not limited to, an amorphous resin and a coupling agent. Specific examples of the amorphous resin include, but are not limited to a resin having a perfluoropolyether structure in its main backbone.

Specific examples of the coupling agent include, but are not limited to, a metal alkoxide, and a solution containing a metal alkoxide.

Specific examples of the metal alkoxide include, but are not limited to, a compound represented by the following formula (1), a partially-hydrolyzed polycondensate thereof having a polymerization degree of about 2 to 10, and a mixture thereof.

$$R^1_{(4-n)}Si(OR^2)_n \tag{1}$$

In the formula (1), each of $R^1$ and $R^2$ independently represents a straight-chain or branched-chain alkyl group having 1 to 10 carbon atoms, an alkyl polyether chain, or an aryl group; and n represents an integer of from 2 to 4.

The inactivation treatment may be performed by, for example, subjecting a precursor (e.g., rubber) of the intermediate layer 20 to the surface modification treatment first, and then coating or impregnating (e.g., by means of dipping) the surface of the precursor of the intermediate layer 20 with an inactivator.

When a silicone rubber is used as the precursor of the intermediate layer 20, the silicone rubber may be subjected to the surface modification treatment first, and then left at rest in the air to be inactivated through air drying.

Preferably, the oxygen concentration profile of the intermediate layer 20 has a local maximum value in the thickness direction. Preferably, the carbon concentration profile of the intermediate layer 20 has a local minimum value in the thickness direction.

Preferably, in the intermediate layer 20, a position which indicates a local maximum value in the oxygen concentration profile is coincident with a position which indicates a local minimum value in the carbon concentration profile.

The oxygen concentration profile and the carbon concentration profile can be determined by X-ray photoelectron spectroscopy (XPS) under the following conditions.
Measurement Conditions
  Measurement Device: ULVAC-PHI QUANTERA SXM available from ULVAC-PHI, Inc.
  Measurement Light Source: Al (mono)
  Measurement Output: 100 μm φ, 25.1 W
  Measurement Area: 500 μm×300 μm
  Pass Energy: 55 eV (narrow scan)
  Energy Step: 0.1 eV (narrow scan)
  Relative Sensitivity Factor: Relative sensitivity factor of PHI is used
    Sputter Source: C60 Cluster ion
    Ion Gun Output: 10 kV, 10 nA
    Raster Control: (X=0.5, Y=2.0) mm
    Sputter Rate: 0.9 nm/min ($SiO_2$ conversion)

XPS analyzes atomic composition and binding state of a target object by capturing electrons which escaped from the target object by the photoelectron effect.

Silicone rubbers have siloxane bonds. The major components of silicone rubbers include Si, O, and C. In a case in which the intermediate layer 20 is formed of a silicone rubber, the atomic composition of the intermediate layer 20 in the depth direction, in other words, the atomic concentration (%) distribution of the major atoms (Si, O, or C) ranging from the surface part to the inner part of the intermediate layer 20, can be determined from a relative peak strength ratio in a wide scan spectrum measured by XPS. One example of the wide scan spectrum is illustrated in FIG. 5.

The spectrum illustrated in FIG. 5 is measured with one sample of the intermediate layer 20 which is prepared by subjecting a silicone rubber to the above-described plasma treatment (as the surface modification treatment) and the above-described inactivation treatment. In FIG. 5, the horizontal axis represents the analysis depth measured from the surface part toward the inner part, and the vertical axis represents the atomic concentration (%).

In the case of a silicone rubber, elements bound to silicon atoms and the binding state thereof can be determined by measuring the energy of electrons escaped form the Si2p orbit. Specifically, by separating peaks in a narrow scan spectrum of the Si2p orbit, which indicates binding state of Si, a chemical binding state of Si can be determined.

Figure 6:
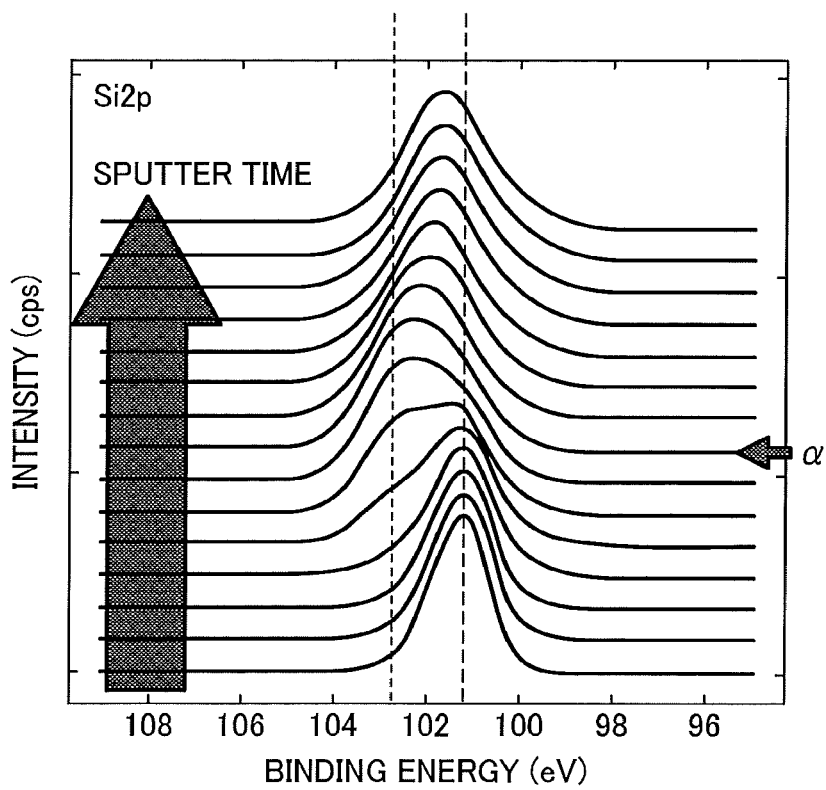
FIG. 6 is a graph showing a variation in the Si2p binding energy of the intermediate layer used to obtain the chart of FIG. 5 in the thickness direction.

The result of peak separation is illustrated in FIG. 6. The graph illustrated in FIG. 6 was measured with the same sample of the intermediate layer 20 used to obtain the chart of FIG. 5. In FIG. 6, the horizontal axis represents binding energy, and the vertical axis represents intensity. Each curve represents a spectrum measured at each depth. A spectrum on a lower side indicates a greater (deeper) measurement depth.

It is generally known that the amount of peak shift depends on the binding state. In the case of the silicone rubber according to the present embodiment, the peak is shifted toward a high-energy side with respect to the Si2p orbit. This indicates that the amount of oxygen atoms bound to Si has been increased.

As the silicone rubber is subjected to the surface modification treatment and the inactivation treatment, the amount of oxygen is increased from the surface part toward the inner part while exhibiting a local maximum value, while the amount of carbon is decreased while exhibiting a local minimum value. As the silicone rubber is further analyzed in the depth direction, the amount of oxygen is decreased and the amount of carbon is increased to have the same atomic composition as an untreated silicone rubber.

The fact that the local maximum value in the oxygen concentration profile is detected at the position α in FIG. 5 is coincident with the fact that the Si2p binding energy is shifted to a high-energy side (as indicated by α in FIG. 6). This indicates that an increase of oxygen atoms is detected from the number of oxygen atoms bound to Si.

Figure 7:
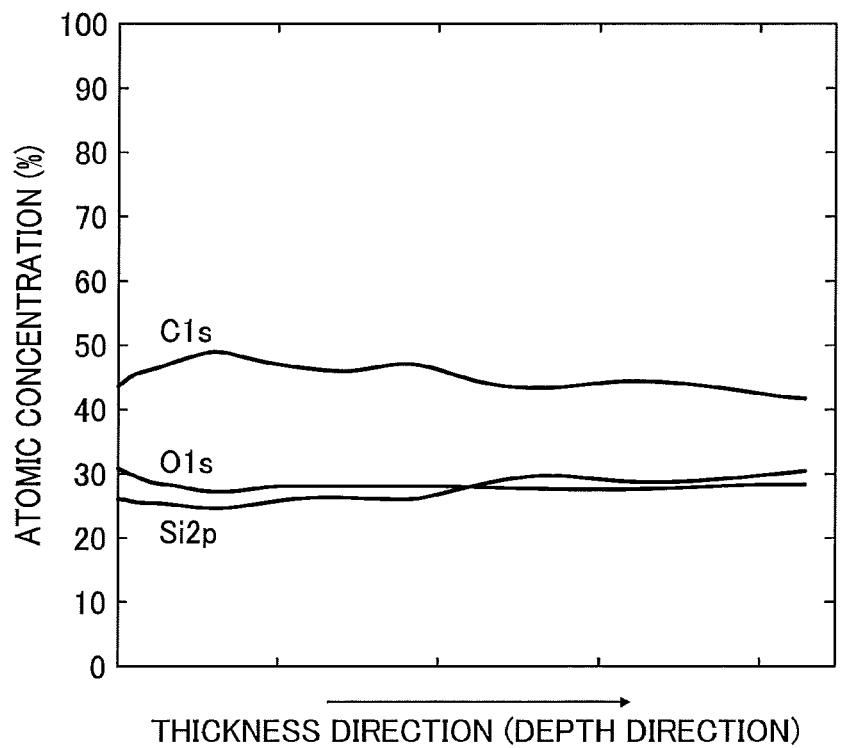
FIG. 7 is an XPS chart of an untreated intermediate layer, formed of a silicone rubber.
Figure 8:
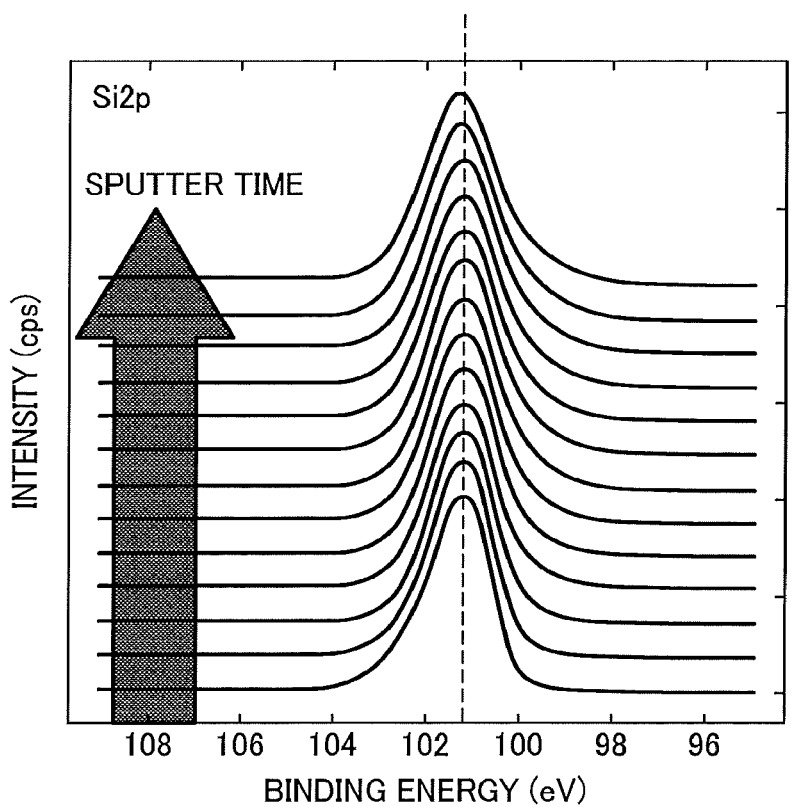
FIG. 8 is a graph showing a variation in the Si2p binding energy of the intermediate layer used to obtain the chart of FIG. 7 in the thickness direction.

FIGS. 7 and 8 show results for an untreated silicone rubber with respect to the same analysis performed to obtain graphs of FIGS. 5 and 6, respectively.

In FIG. 7, no local maximum value is observed in the oxygen concentration profile, and no local minimum value is observed in the carbon concentration profile, in contrast to FIG. 5. In addition, in FIG. 8, the Si2p binding energy is not shifted to a high-energy side. This indicates that the number of oxygen atoms bound to Si has not been changed.

As the surface of the intermediate layer 20 is coated or impregnated (e.g., by means of dipping) with the inactivator (e.g., a coupling agent), the inactivator gradually penetrates the intermediate layer 20. In a case in which the coupling agent is the compound represented by the formula (1), polyorganosiloxane will be distributed within the intermediate layer 20. The concentration distribution of oxygen atoms included in the polyorganosiloxane will exhibit a local maximum value in the depth direction.

As a result, the intermediate layer 20 comes to include polyorganosiloxane containing silicon atoms bound to 3 to 4 oxygen atoms.

The inactivation treatment are not limited to dipping, so long as oxygen atoms included in polyorganosiloxane are distributed such that the concentration distribution thereof exhibits a local maximum value in the depth direction (thickness direction). Specific examples of the inactivation treatment include, but are not limited to, plasma CVD (chemical vapor deposition), PVD (physical vapor deposition), sputtering, vacuum deposition, and combustion chemical vapor deposition.

The intermediate layer 20 needs not necessarily have an initial surface potential at rest. The initial surface potential at rest can be measured under the following conditions. Here, having no initial surface potential refers to having an initial surface potential of ±10 V or less, when measured under the following conditions.
Measurement Conditions
  Pretreatment: Left at rest in an atmosphere having a temperature of 30° C. and a relative humidity of 40% for 24 hours and subjected to a neutralization for 60 seconds (using an instrument SJ-F300 available from Keyence Corporation).

Instrument: Treck Model 344
Measurement Probe: 6000B-7C
Measurement Distance: 2 mm
Measurement Spot Diameter: 10 mm Within the element according to the present embodiment, a bias in capacitance is caused upon a charging, the mechanism of which is similar to triboelectric charging, and a generation of surface potential difference due to inner charge retention, according to the difference in deformation amount between both sides of the intermediate layer 20 that is caused by the difference in hardness therebetween. It is considered that such a bias in capacitance causes charge transfer and further causes power generation.

Preferably, a space is provided between the intermediate layer 20 and at least one of the first electrode 19 and the second electrode 21, to increase the amount of power generation.

For example, such a space can be provided by disposing a spacer between the intermediate layer 20 and at least one of the first electrode 19 and the second electrode 21.

The spacer is not limited in material, configuration, shape, and size. Specific examples of materials used for the spacer include, but are not limited to, polymeric materials, rubbers, metals, conductive polymeric materials, and conductive rubber compositions.

Specific examples of the polymeric materials include, but are not limited to, polyethylene, polypropylene, polyethylene terephthalate, polyvinyl chloride, polyimide resin, fluororesin, and acrylic resin.

Specific examples of the rubber include, but are not limited to, silicone rubber, modified silicone rubber, acrylic rubber, chloroprene rubber, polysulfide rubber, urethane rubber, isobutyl rubber, fluorosilicone rubber, ethylene rubber, and natural rubber (latex).

Specific examples of the metals include, but are not limited to, gold, silver, copper, aluminum, stainless steel, tantalum, nickel, and phosphor bronze. Specific examples of the conductive polymeric materials include, but are not limited to, polythiophene, polyacetylene, and polyaniline. Specific examples of the conductive rubber compositions include, but are not limited to, a composition including a conductive filler and a rubber. Specific examples of the conductive filler include, but are not limited to, carbon materials (e.g., Ketjen black, acetylene black, graphite, carbon fiber, carbon nanofiber, carbon nanotube, graphene), metal fillers (e.g., gold, silver, platinum, copper, iron, aluminum, nickel), conductive polymeric materials (e.g., derivatives of polythiophene, polyacetylene, polyaniline, polypyrrole, polyparaphenylene, or polyparaphenylene vinylene, to which a dopant, such as anion and cation, may be added), and ionic liquids.

Specific examples of the rubber include, but are not limited to, silicone rubber, modified silicone rubber, acrylic rubber, chloroprene rubber, polysulfide rubber, urethane rubber, isobutyl rubber, fluorosilicone rubber, ethylene rubber, and natural rubber (latex).

The spacer may be in the form of a sheet, film, woven fabric, non-woven fabric, mesh, or sponge. The shape, size, thickness, and installation location of the spacer is appropriately determined according to the structure of the element.

Figure 9:
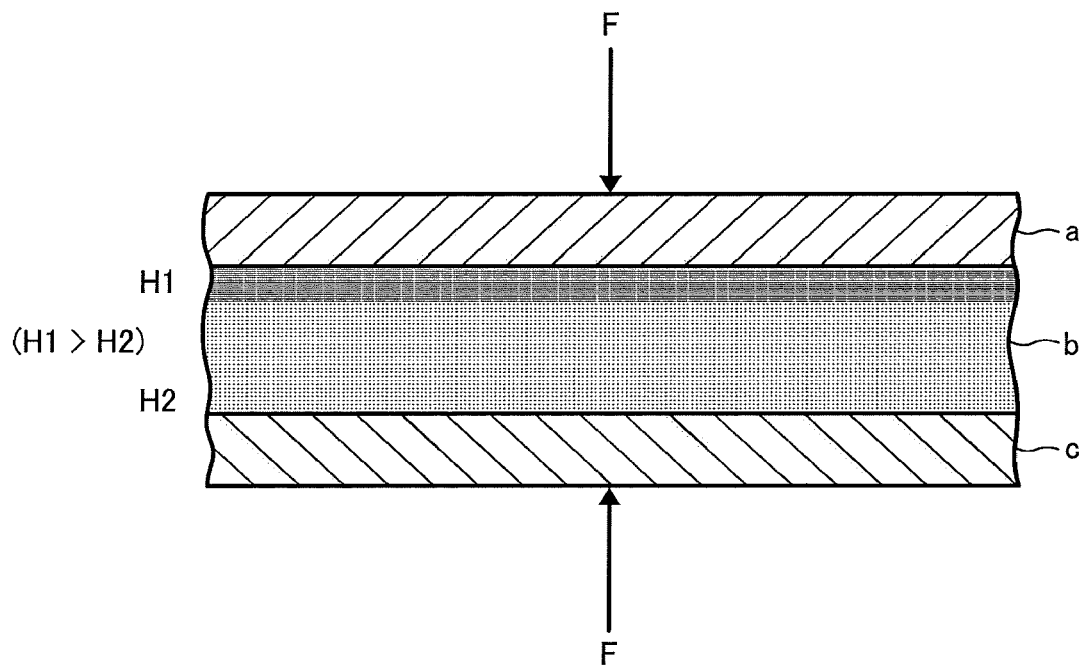
FIG. 9 is a cross-sectional view of an element including a surface-modified inactivated intermediate layer according to an embodiment of the present invention.

In the embodiment illustrated in FIG. 9, the first electrode 19, the intermediate layer 20, and the second electrode 21 are indicated by symbols a, b, and c, respectively. In a case in which one side of the intermediate layer b which faces the first electrode a is subjected to the surface modification treatment or the inactivation treatment, the universal hardness H1 of that side of the intermediate layer b which faces the first electrode a becomes greater than the universal hardness H2 of the other side of the intermediate layer b which faces the second electrode c.

When a pressing force F is respectively applied to both sides of the intermediate layer b, the degree of deformation of one side of the intermediate layer b facing the first electrode a becomes smaller than that of the other side of the intermediate layer b facing the second electrode c.

Support

The support is not limited in material, shape, size, thickness, and structure.

Specific examples of materials used for the support include, but are not limited to, polymeric materials, rubbers, and metals.

Specific examples of the polymeric materials include, but are not limited to, polyethylene, polypropylene, polyethylene terephthalate, polyvinyl chloride, polyimide resin, fluororesin, acrylic resin, and cellulose.

Specific examples of the rubbers include, but are not limited to, silicone rubber, fluorosilicone rubber, fluorine rubber, urethane rubber, acrylic rubber, chloroprene rubber, butyl rubber, ethylene propylene rubber, nitrile rubber, polysulfide rubber, and natural rubber (latex).

Specific examples of the metals include, but are not limited to, aluminum, stainless steel, iron, copper, hard steel, silicon chromium steel, phosphor bronze, and piano wire.

The support may be in the form of a string, loop, string, flat plate, or block.

Cover

The cover 5 is not limited in material, shape, size, thickness, and structure. Specific examples of materials used for the cover 5 include, but are not limited to, polymeric materials and rubbers.

Specific examples of the polymeric materials include, but are not limited to, polyethylene, polypropylene, polyethylene terephthalate, polyvinyl chloride, polyimide resin, fluororesin, and acrylic resin.

Specific examples of the rubbers include, but are not limited to, silicone rubber, fluorosilicone rubber, fluorine rubber, urethane rubber, acrylic rubber, chloroprene rubber, butyl rubber, ethylene propylene rubber, nitrile rubber, polysulfide rubber, and natural rubber (latex).

Figure 10:
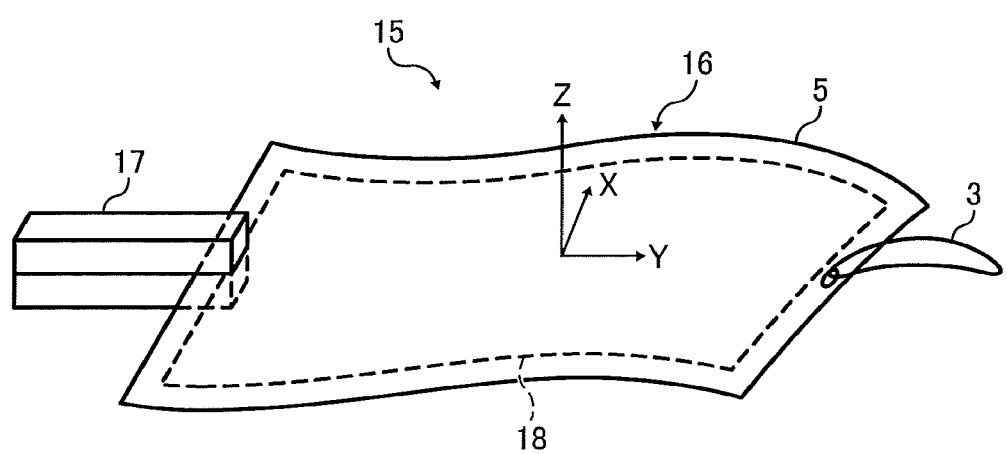
FIG. 10 is a perspective view of the power generating device according to the second embodiment of the present invention, in a state of receiving a vibration.

In the present embodiment, the element 16 is suspended in the air as illustrated in FIG. 3. Thus, the element 16 is capable of receiving a vertical vibration in large amounts as illustrated in FIG. 10.

The element 16 is supported such that the plane surface thereof orthogonally intersects the direction of the vertical vibration (i.e., Z direction).

As indicated in Table 1 (research results made by Nittsu Research Institute And Consulting), with respect to truck transports, a vibration in Z direction (i.e., vertical vibration) is large.

TABLE 1

| Transportation Means | Measurement Conditions | | | Acceleration Rate (G) | | |
|---|---|---|---|---|---|---|
| | | | | Vertical Direction | Horizontal Direction | Front-Back Direction |
| Truck | General Road | 20-40 km/h | Paved | 0.4-0.7 | 0.1-0.2 | 0.1-0.2 |
| | | | Unpaved | 1.3-2.4 | 0.4-1.0 | 0.5-1.5 |
| | Freeway | 80-100 km/h | Loaded | 0.6-1.0 | 0.2-0.5 | 0.1-0.4 |
| | | | Unloaded | 1.0-1.6 | 0.6-1.4 | 0.3-0.9 |
| | Getting across about 2-cm step | | | 1.6-2.5 | 1.0-2.4 | 1.1-2.3 |
| | Braking at 35 km/h | | | 0.2-0.7 | | 0.6-0.7 |
| Railway | Running | On Rail | | 0.1-0.4 | 0.1-0.2 | 0.1-0.2 |
| | | On Rail Joint | | 0.2-0.6 | 0.1-0.2 | 0.1-0.2 |
| | Crash Stop | | | 0.6-0.8 | 0.1-0.8 | 1.5-1.6 |
| | Car Coupling | | | 0.1-0.2 | 0.1-0.2 | 0.2-0.7 |
| | Container Handling | | | 2.5-4.5 | 1.0-2.5 | 1.0-1.5 |
| Aircraft | Takeoff | | | 0.2-0.5 | 0.1 | 0.1-0.2 |
| | Landing | | | 0.3-1.0 | 0.1-0.2 | 0.2-0.3 |
| | Air Pocket | | | 2.0-2.4 | | |

Figure 14:
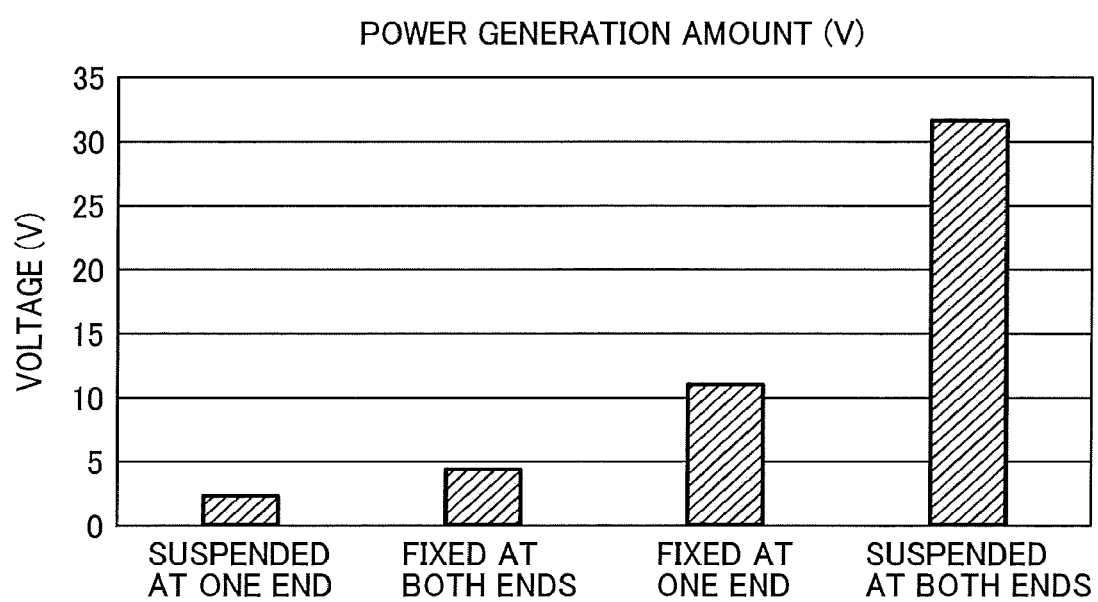
FIG. 14 is a graph showing differences in power generation amount among some power generating devices according to some embodiments of the present invention.

When the element 16 is supported such that the plane surface thereof orthogonally intersects the direction of vertical vibration, the element 16 is caused to make a large swing or undulation and undergo a bending deformation, a torsional deformation, or a bending-torsional complex deformation, thus increasing power generation amount. A comparison result in power generation amount is illustrated in FIG. 14. In FIG. 14, the above configuration illustrated in FIG. 3 is labeled as "fixed at one end".

A vibration test is performed using a vibration tester configured to attach a vibration probe to the upper surface of a rectangular sample stage, the lower surface of which is supported with coil springs at the four corners, to vibrate the sample stage up and down. In the vibration test, each power generation device is put on the sample stage.

The test conditions are as follows. The contact point of the vibration probe with the sample stage is defined as the zero point.

Displacement: 3.5 mm (±1.75 mm)
Frequency: 15 Hz
Acceleration Rate: 3 G

Figure 11:
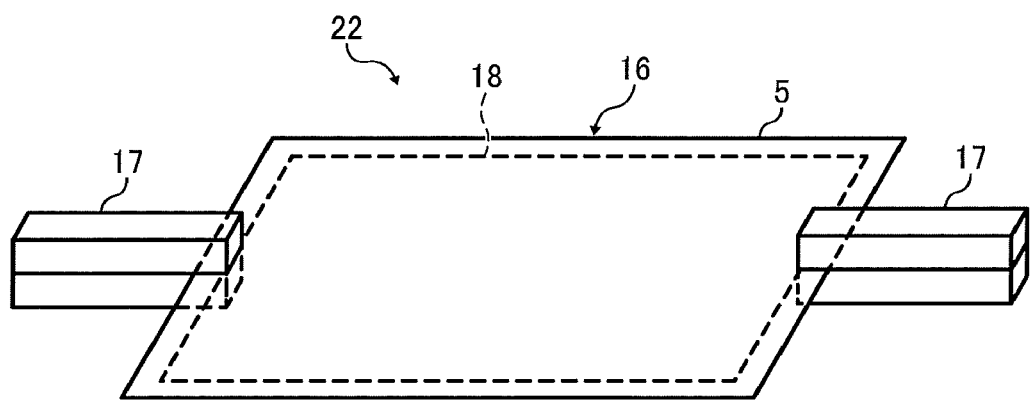
FIG. 11 is a perspective view of a modification of the power generating device according to an embodiment of the present invention.

As illustrated in FIG. 11, in a power generating device 22 according to another embodiment of the present invention, both ends of the element 16 is respectively supported with the fixed support 17. This configuration is labeled as "fixed at both ends" in FIG. 14.

Compared to the above-described case in which one end of the element 16 is supported with the variable support 3 in the form of a string, labeled as "fixed at one end" in FIG. 14, the amount of deformation of the element 16 is smaller, because both end-part planes of the element 16 are restrained by the fixed supports 17.

It is clear from FIG. 14 that the configuration illustrated in FIGS. 1A and 1B, labeled as "suspended at one end", is the smallest in terms of power generation amount. This is because the element 2 in FIGS. 1A and 1B is disposed in parallel with the direction of vertical vibration (Z direction), and therefore the degree of deformation of the element 2 caused by the vibration is small.

Figure 12:
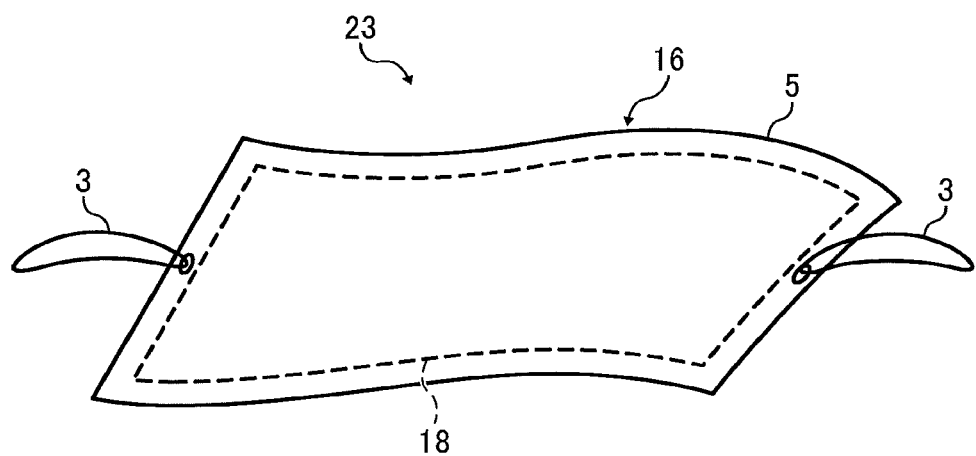
FIG. 12 is a perspective view of a modification of the power generating device according to an embodiment of the present invention.

As illustrated in FIG. 12, in a power generating device 23 according to another embodiment of the present invention, both ends of the element 16 is respectively supported with the variable support 3 such that the element 16 is suspended in the air. This configuration is labeled as "suspended at both ends" in FIG. 14.

In this case, because both ends of the element 16 is supported with a small restraining force, the degree of deformation of the element 16 caused by the vibration is large, and therefore power generation amount is also large, as indicated in FIG. 14.

Figure 15:
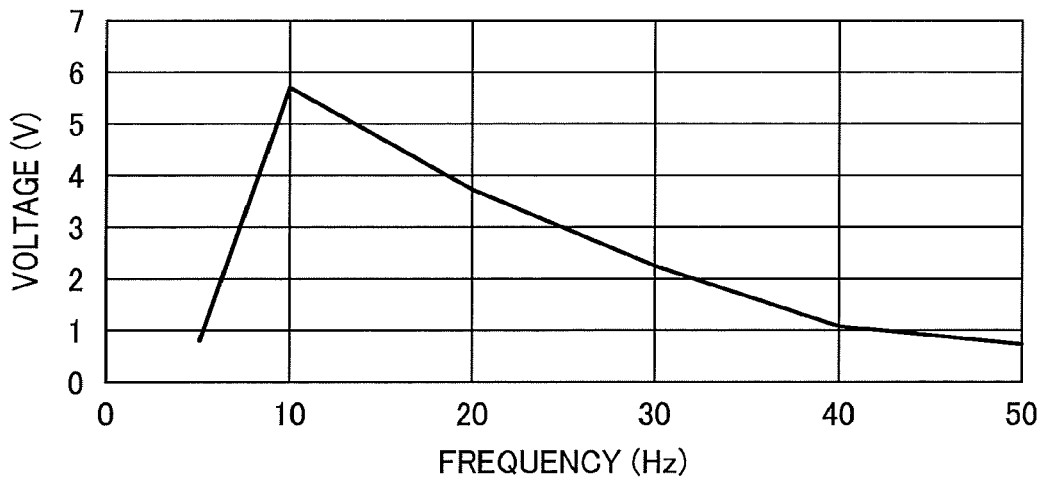
FIG. 15 is a graph showing a frequency characteristic of the power generating device according to an embodiment of the present invention, suspended at both ends.

FIG. 15 is a graph showing a frequency characteristic obtained when a vertical vibration with an acceleration rate of about 0.9 G, which is a similar level to a vibration generated by a truck, is applied to the element.

The graph illustrated in FIG. 15 is obtained through a test performed with the above-described vibration tester under the following conditions, while varying the frequency. The contact point of the vibration probe with the sample stage is defined as the zero point.

Displacement: 1.4 mm (±0.7 mm)
Frequency: 5 Hz, 10 Hz, 20 Hz, 30 Hz, 40 Hz, 50 Hz
Acceleration Rate: 0.9 G It is clear from FIG. 15 that power is generated when the frequency is in the range of about 10 to 30 Hz. Even when the frequency is 40 Hz or greater, a voltage of about 1 V is generated.

With respect to conventional power generating devices, power generation amount is extremely reduced if the frequency is deviated from the resonance frequency, even only slightly. By contrast, with respect to the power generating device according to the present embodiment, a variation in power generation amount is small (gradual) even when the frequency is varied.

As illustrated in FIG. 18, a vibration generated by a truck deck has a frequency of 30 Hz or less. Therefore, the power generating device according to some embodiments of the present invention is capable of efficiently utilizing the vibration generated by the truck deck for generating power.

Thus, the power generating device according to some embodiments of the present invention is capable of generating power utilizing vibration energy generated by a truck deck within an entire frequency range, regardless of the resonance frequency.

It is clear from the several drawings (e.g., FIG. 12) that the power generating device according to some embodiment of the present invention has a simple flat-plate-like shape.

The power generating device according to some embodiment of the present invention is capable of effectively generating power using vibration energy even its frequency is low, without a complicated configuration. Such a power generating device can be easily used in various situations where environmental vibration occurs.

Figure 13:
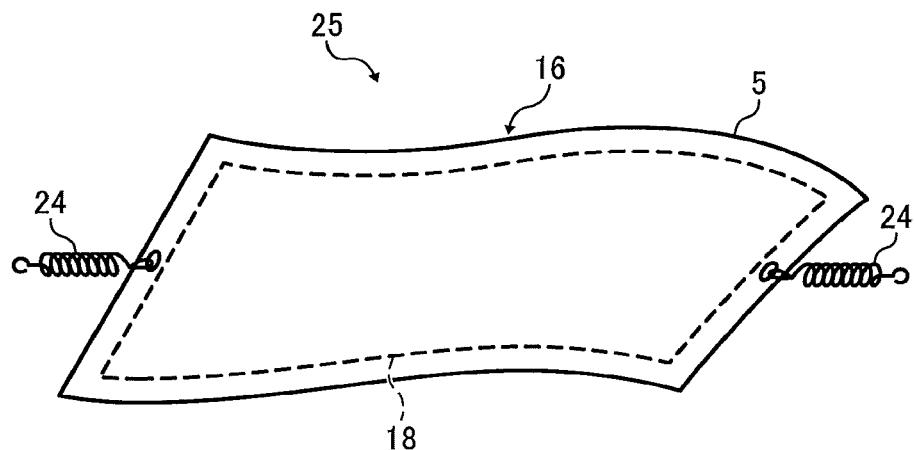
FIG. 13 is a perspective view of a modification of the power generating device according to an embodiment of the present invention.

As illustrated in FIG. 13, in a power generating device 25 according to another embodiment of the present invention, both ends of the element 16 is respectively supported with a coil spring 24, serving as an elastic member, in place of the variable support 3 in the form of a string. The power generating device 25 is of "suspended at both ends" type. The variable support 3 may be formed of one piece of rubber string.

It has been experimentally confirmed that when the element is suspended in the air with an excessive tension, power generation amount is decreased. When the element is horizontally suspended with a certain degree of slack, the degree of deformation (undulation) of the element becomes greater and power generation amount is increased.

It is possible to improve power generation efficiency by changing the material of the variable support in accordance with the size and type of the vibration or adjusting the tension.

In the present disclosure, "support" performed by the variable support includes the concept of "mooring". The variable support supports the element so as to prevent the element from separating from the support.

Accordingly, even in a case in which the element is put on and brought into contact with a vibration surface by its own weight, while being moored by the support, the element is caused to vibrate and deform by the vibration of the vibration surface, thus generating power.

In the above-described embodiments, each of the elements 2 and 16 and element bodies 4 and 18 includes an electret electrode or an intermediate layer (power generating rubber) exhibiting a property similar to piezoelectric property. However, the configurations of the elements and element bodies are not limited thereto. Each of the elements and element bodies may include PVDF (polyvinylidene fluoride) having piezoelectric property.

Figure 16:
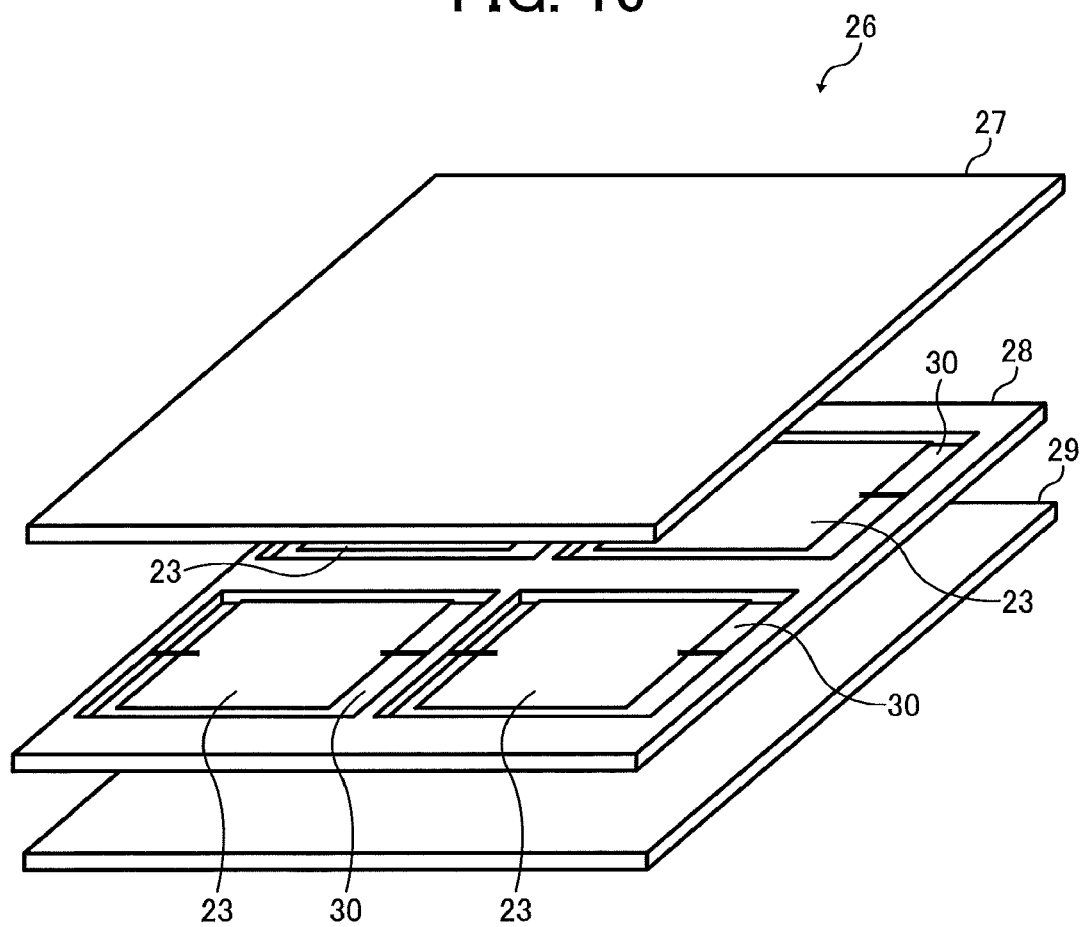
FIG. 16 is an exploded perspective view of a power generating package using the power generating device according to an embodiment of the present invention.
Figure 17:
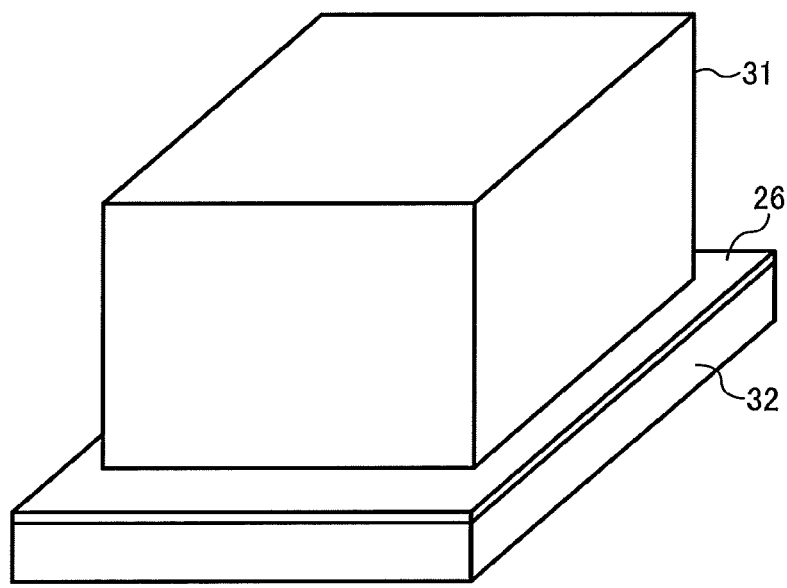
FIG. 17 is a perspective view of the power generating package illustrated in FIG. 16 in use.

FIGS. 16 and 17 illustrate a use application of the power generating device according to an embodiment of the present invention. In particular, this use application refers to a power generating package in which the power generating device 23 illustrated in FIG. 12, suspended at both ends, utilizes a vibration generated by a truck deck.

Referring to FIG. 16, a power generating package 26 includes an upper plate 27, a middle plate 28, and a lower plate 29, which are overlaid on one another and bonded to each other. The middle plate 28 has four hollow spaces 30 each having a rectangular shape. Within each hollow space 30, an independent power generating device 23 is deformably suspended in the air.

As illustrated in FIG. 17, the power generating package 26 may be put on an upper surface of a pallet 32 that is to be loaded on a truck deck while carrying a package 31 thereon.

A vibration generated while the truck is running is transmitted to the power generating device 23 via the pallet 32, and the element 16 is caused to deform to generate power.

The power generating package 26 may be directly put on the truck deck or mounted on the roof of the truck deck. The power generating package 26 can be mounted on any place where the vibration is transmittable.

Electric power obtained by the power generating package 26 may be used as a power source for a temperature sensor that detects the temperature inside the truck deck storage, or stored in a power storage body integrally mounted on the power generating package 26 or loaded together with the power generating package 26.

Power generation using vibration is not influenced by weather, unlike solar power generation.

The casing of the power generating package 26 is formed of a material undeformable by the weight of a package to be put thereon, such as aluminum. The power generating package 26 may be permanently installed on the pallete 32 to become integrated with the pallet 32.

The vibration source is not limited to truck deck. The power generating device according to some embodiments of the present invention can be used in various situation where environmental vibration energy is usable.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A power generating device comprising:
an element having flexibility, the element being deformable when receiving a vibration and configured to generate power when undergoing deformation, the deformation including at least one of a bending deformation, a torsional deformation, and a bending-torsional complex deformation, the element including a first base and a second base facing the first base, the first base including a first electrode, the second base including a second electrode arranged to be adjacent the first electrode, the element further including an intermediate layer having flexibility, overlying the first electrode, the second electrode overlying the intermediate layer, the intermediate layer being made of silicone rubber having surface modification; and
a support to support at least one portion of the element,
wherein a distance between the first electrode and the second electrode is variable by the deformation, and an overlapping area of the first electrode and the second electrode is variable by the deformation,
wherein the intermediate layer includes a first surface facing the first electrode and a second surface facing the second electrode, and
wherein, when a deformation imparting force is applied to the element, the first surface and the second surface deform at different degrees of deformation.

2. The power generating device of claim 1, wherein the support suspends the element in the air.

3. The power generating device of claim 1, wherein the element includes:
an element body; and
a cover to cover the element body, the cover supported by the support.

4. The power generating device of claim 1, wherein the support is deformable along with the deformation of the element.

5. The power generating device of claim 4, wherein the support is in the form of a string or loop.

6. The power generating device of claim 1, wherein the element is in the form of a flat plate.

7. The power generating device of claim 6, wherein the support supports at least two portions of the element to suspend the element in the air such that a plane of the flat plate intersects a direction of the vibration.

8. The power generating device of claim 1, wherein the element exhibits a piezoelectric property or a property similar to the piezoelectric property.

9. The power generating device of claim 1, wherein
the first electrode is an electret electrode; and
the second electrode is a metal electrode facing the electret electrode.

\* \* \* \* \*